US006787053B2

(12) United States Patent
Sekiya et al.

(10) Patent No.: US 6,787,053 B2
(45) Date of Patent: Sep. 7, 2004

(54) CLEANING GASES AND ETCHING GASES

(75) Inventors: Akira Sekiya, Tsukuba (JP); Yuki Mitsui, Tokyo (JP); Ginjiro Tomizawa, Tsukuba (JP); Katsuya Fukae, Shibukawa (JP); Yutaka Ohira, Tokyo (JP); Taisuke Yonemura, Tokyo (JP)

(73) Assignees: Asahi Glass Company, Limited, Tokyo (JP); Anelva Corporation, Fuchu (JP); Ulvac, Inc., Chigasaki (JP); Kanto Denka Kogyo Co., Ltd., Tokyo (JP); Sanyo Electric Co., Ltd., Moriguchi (JP); Sony Corporation, Tokyo (JP); Daikin Industries, Ltd., Osaka (JP); Tokyo Electron Limited, Tokyo (JP); NEC Electronics Corporation, Kawasaki (JP); Hitachi Kokusai Electric Inc., Tokyo (JP); Matsushita Electric Industrial Co., Ltd., Kadoma (JP); Renesas Technology Corp., Tokyo (JP)

( * ) Notice: Subject to any disclaimer, the term of this patent is extended or adjusted under 35 U.S.C. 154(b) by 0 days.

(21) Appl. No.: 10/129,115
(22) PCT Filed: Sep. 7, 2001
(86) PCT No.: PCT/JP01/07782
§ 371 (c)(1),
(2), (4) Date: May 13, 2002
(87) PCT Pub. No.: WO02/23608
PCT Pub. Date: Mar. 21, 2002

(65) Prior Publication Data
US 2003/0001134 A1 Jan. 2, 2003

(30) Foreign Application Priority Data
Sep. 11, 2000 (JP) .................................. 2000-275647
Aug. 30, 2001 (JP) .................................. 2001-261471

(51) Int. Cl.$^7$ ............................................. C03C 15/00
(52) U.S. Cl. .......................... 216/58; 216/79; 252/79.1; 510/109; 510/188
(58) Field of Search .................... 216/58, 79; 252/79.1; 510/109, 188

(56) References Cited

U.S. PATENT DOCUMENTS

| 3,721,696 A | | 3/1973 | Sianesi et al. ............... 260/463 |
| 5,539,211 A | * | 7/1996 | Ohtoshi et al. ........ 250/441.11 |
| 6,107,192 A | * | 8/2000 | Subrahmanyan et al. ... 438/637 |

FOREIGN PATENT DOCUMENTS

| EP | 924282 | 6/1999 |
| JP | 6-132259 | 5/1994 |
| JP | 8-139010 | 5/1996 |
| JP | 8-291299 | 11/1996 |
| JP | A 10-223614 | 8/1998 |
| JP | 10-312991 | 11/1998 |
| JP | 2000-265275 | 9/2000 |
| JP | 2001-28362 | 1/2001 |

* cited by examiner

Primary Examiner—Allan Olsen
(74) Attorney, Agent, or Firm—Oblon, Spivak, McClelland, Maier & Neustadt, P.C.

(57) ABSTRACT

The first chamber cleaning gas and the first silicon-containing film-etching gas of the present invention comprise at least one compound selected from the group consisting of FCOF, $CF_3OCOF$ and $CF_3OCF_2OCOF$, and $O_2$ in the specific amount, and optionally other gases. The second chamber cleaning gas and the second silicon-containing film-etching gas comprise $CF_3COF$, $C_3F_7COF$ or $CF_2(COF)_2$ and $O_2$ in specific amounts, and optionally may comprise other gases. The chamber cleaning gases and silicon-containing film etching gases of the present invention have a low global warming potential and hardly generate substances in the exhaust gases such as $CF_4$, etc, which are harmful to the environment and have been perceived as contributing to global warming. Therefore, the gases are friendly to the global environment, and have easy handling and excellent exhaust gas treating properties. Further, the chamber cleaning gases of the invention have excellent cleaning rate.

27 Claims, No Drawings

CLEANING GASES AND ETCHING GASES

FIELD OF THE INVENTION

The present invention relates to a chamber cleaning gas and an etching gas More particularly, the invention relates to a chamber cleaning gas suitable for CVD equipment and an etching gas in production of semiconductor devices, wherein both gases comprise a fluorine-containing carbonyl compound having a COF group, and hardly generate substances in the exhaust gases such as $CF_4$, etc, which are harmful to the environment because of being perceived as contributing to global warming.

BACKGROUND OF THE INVENTION

In conventional production process of thin film devices for semiconductor manufacturing and the like, various thin films and thick films have been formed by CVD process, etc. In forming such thin films on wafers for semiconductor device, thin film materials unfavorably stick to the inner wall of a chamber, jigs supporting an object or pipes in addition to the object to form films. Such deposits induce the cause of contaminating semiconductor products with fine particles, and thereby high quality thin films are hardly prepared and further the yield of the products is lowered. Therefore, the removal thereof is necessary occasionally. Conventionally, the removal of deposits has been conducted manually or by a cleaning gas or the like.

In semiconductors, circuit patterns are formed on various thin film materials constituting semiconductor circuits so that the partial removal of thin film materials has been conducted by gas etching.

With regard to the basic properties required for such cleaning gas or etching gas, the cleaning gas is desired to have a high cleaning rate, and the etching gas is desired to have a high rate of etching objects and high selectivity. The both gases are required not to produce harmful exhaust gases to the environment and to be friendly toward the global environment.

Conventionally, as gases for cleaning such deposits or gases for etching thin films, large amounts of fluorinated compounds such as $CF_4$, $C_2F_6$, $SF_6$ or $NF_3$ have been used in processes of manufacturing semiconductors.

These fluorinated compounds, however, are stable compounds having a long atmospheric lifetime, and have a problem in that, after cleaning or etching with these gases, it is difficult to treat un-decomposed gases and the treatment cost thereof is high. These fluorinated compounds, further, have an extremely high global warming potential (100 year integration time horizon) as compared with $CO_2$, for example, $CF_4$ has a global warming potential 6500 times greater than that of $CO_2$, $C_2F_6$ has 9200 times, $SF_6$ has 23900 times and $NF_3$ has 8000 times. Therefore, the fluorinated compounds have an uneasy problem of exerting an adverse influence upon the environment. On this account, the development of an alternative gas having a low global warming potential, excellent cleaning properties for silicon-containing deposits of semiconductors and etching properties for silicon-containing films has been desired.

Further, even if the cleaning gas itself has no perceptible influence to the environment, the cleaning gas is decomposed after cleaning or etching with the result that a gas having a long atmospheric lifetime and being environmentally harmful, such as $CF_4$, etc, is occasionally generated. Therefore, the development of alternative gases that decomposed gases thereof exert no adverse influence upon the environment has been desired. In the light of the foregoing, it is an object of the invention to provide a gas for cleaning chambers such as CVD equipment having excellent cleaning properties to silicon-containing deposits being suitable for manufacturing of semiconductors, and an etching gas having etching properties to silicon-containing films, wherein the gases have a low global warming potential, hardly generate substances in the exhaust gases such as $CF_4$, etc which are harmful to the environment and have been perceived as contributing to global warming, and further the gases have excellent exhaust gas treating properties, and easy handling.

DISCLOSURE OF THE INVENTION

The present invention is intended to solve the above problems, and the present inventors found that gases prepared by mixing a specific fluorine-containing carbonyl compound with oxygen have a low global warming potential and hardly generate substances in the exhaust gases such as $CF_4$, etc which are harmful to the environment and largely affect global warming even after cleaning or etching using the gases, and the gases also have excellent cleaning properties to silicon-containing deposits and etching properties to silicon-containing films.

Thus, the present invention has been accomplished. The details are as follows.

The first chamber cleaning gas according to the present invention comprises FCOF and $O_2$, and optionally other gases wherein the total content of FCOF and $O_2$ is in the range of 70 to 100 mol % based on the total gas amount being 100 mol %.

The mixing molar ratio of FCOF to $O_2$ (FCOF/$O_2$) preferably satisfies the formula $1 \leq FCOF/O_2 \leq 9$.

The first chamber cleaning gas of the invention may comprise $CF_3OCOF$ and $O_2$ and optionally other gases. Further, the first chamber cleaning gas may comprise $CF_3OCF_2OCOF$ and $O_2$, and optionally other gases.

Further, the first chamber cleaning gas of the invention may comprise at least one fluorine compound selected from the group consisting of FCOF, $CF_3OCOF$ and $CF_3OCF_2OCOF$, and $O_2$, and optionally other gases, wherein the total content of $O_2$ and at least one fluorine compound selected from the group consisting of FCOF, $CF_3OCOF$ and $CF_3OCF_2OCOF$ is in the range of 70 to 100 mol % based on the total gas amount being 100 mol %.

The second chamber cleaning gas of the invention comprises $CF_3COF$ and $O_2$, and optionally other gases, wherein the total content of $CF_3COF$ and $O_2$ is in the range of 70 to 100 mol % based on the total gas amount being 100 mol %.

The mixing molar ratio of $CF_3COF$ to $O_2$ ($CF_3COF/O_2$) preferably satisfies the formula $0.25 \leq CF_3COF/O_2 1.5$.

The second chamber cleaning gas of the invention may comprise $C_3F_7COF$ and $O_2$, and optionally other gases, wherein the total content of $C_3F_7COF$ and $O_2$ is in the range of 70 to 100 mol % based on the total gas amount being 100 mol %, and further, the second chamber cleaning gas may comprise $CF_2(COF)_2$ and $O_2$ and optionally, other gases wherein the total content of $CF_2(COF)_2$ and $O_2$ is in the range of 70 to 100 mol % based on the total gas amount being 100 mol %.

The other gases preferably comprises at least one inert gas selected from $N_2$, He, Ne, Ar, Kr, Xe and Rn.

When the chamber cleaning gas contains FCOF, the other gases may contain $CF_3OCOF$ and/or $CF_3OCF_2OCOF$.

The chamber cleaning gas is preferably a gas for cleaning chambers of CVD equipment.

The chamber cleaning gas is preferably a gas for cleaning silicon-containing deposits, and the silicon-containing deposits preferably comprise at least one of (1) silicon, (2) a compound comprising silicon and at least one of oxygen, nitrogen, fluorine and carbon, and (3) a compound of a metal silicide having a high melting point.

The first etching gas for silicon-containing films according to the present invention comprises FCOF and $O_2$, and optionally other gases wherein the total content of FCOF and $O_2$ is in the range of 70 to 100 mol % based on the total gas amount being 100 mol %.

The mixing molar ratio of FCOF to $O_2$ (FCOF/$O_2$) preferably satisfies the formula $1 \leq FCOF/O_2 \leq 9$.

The first etching gas for silicon-containing films of the present invention may comprise $CF_3OCOF$ and $O_2$, and optionally other gases. Further, the first etching gas for silicon-containing films comprises $CF_3OCF_2OCOF$ and $O_2$, and optionally other gases.

Further, the first etching gas for silicon-containing films may comprise at least one fluorine compound selected from the group consisting of FCOF, $CF_3OCOF$ and $CF_3OCF_2OCOF$, and $O_2$, and optionally other gases, wherein the total content Of $O_2$ and at least one fluorine compound selected from the group consisting of FCOF, $CF_3OCOF$ and $CF_3OCF_2OCOF$ is in the range of 70 to 100 mol % based on the total gas amount being 100 mol %.

The second etching gas for silicon-containing films of the present invention comprises $CF_3COF$ and $O_2$, and optionally other gases, wherein the total content of $CF_3COF$ and $O_2$ is in the range of 70 to 100 mol % based on the total gas amount being 100 mol %.

The mixing molar ratio of $CF_3COF$ to $O_2$ ($CF_3COF/O_2$) preferably satisfies the formula $0.25 \leq CF_3COF/O_2 \leq 1.5$.

The second etching gas for silicon-containing films of the present invention may comprise $C_3F_7COF$ and $O_2$, and optionally other gases, wherein the total content of $C_3F_7COF$ and $O_2$ is in the range of 70 to 100 mol % based on the total gas amount being 100 mol %. Further, the second etching gas for silicon-containing films may comprise $CF_2(COF)_2$ and $O_2$, and optionally other gases, wherein the total content of $CF_2(COF)_2$ and $O_2$ is in the range of 70 to 100 mol % based on the total gas amount being 100 mol %.

The other gases preferably comprise at least one inert gas selected from $N_2$, He, Ne, Ar, Kr, Xe and Rn.

When the etching gas for silicon-containing films contains FCOF, the other gases may contain $CF_3OCOF$ and/or $CF_3OCF_2OCOF$.

The silicon-containing films preferably comprise at least one of (1) a silicon film, (2) a film comprising silicon and at least one of oxygen, nitrogen, fluorine and carbon, and (3) a film of a metal silicide having a high melting point.

BEST MODE FOR CARRYING OUT THE INVENTION

The chamber cleaning gas for silicon-containing deposits and the etching gas for silicon-containing films of the present invention are gases prepared by mixing a specific fluorine-containing carbonyl compound having a COF group with oxygen. Each gas will be described hereinafter.
[Chamber Cleaning Gas]

The first chamber cleaning gas of the present invention is a cleaning gas comprising at least one compound selected from the group consisting of FCOF, $CF_3OCOF$ and $CF_3OCF_2OCOF$.

The second chamber cleaning gas of the present invention is a chamber cleaning gas comprising $CF_3COF$, $C_3F_7COF$ or $CF_2(COF)_2$.

These will be described in order hereinafter.

<A Cleaning Gas Comprising at Least One Compound Selected From the Group Consisting of FCOF, $CF_3OCOF$ and $CF_3OCF_2OCOF$>

The first chamber cleaning gas of the invention is a cleaning gas comprising at least one compound selected from the group consisting of FCOF, $CF_3OCOF$ and $CF_3OCF_2OCOF$.

Of these, FCOF is preferably used.

In the use of FCOF, the chamber cleaning gas comprises FCOF and $O_2$, and optionally other gases and the total content of FCOF and $O_2$ is desirably in the range of 70 to 100 mol % based on the total gas amount being 100 mol %.

The mixing molar ratio of FCOF to $O_2$ (FCOF/$O_2$) desirably satisfies $1 \leq FCOF/O_2 \leq 9$, preferably $1.5 \leq FCOF/O_2 \leq 6$, more preferably $2.3 \leq FCOF/O_2 \leq 6$.

In the chamber cleaning gas containing FCOF, examples of the other gases optionally contained may include an inert gas such as $N_2$, He, Ne, Ar, Kr, Xe and Rn. The inert gas may be used alone or in a mixed gas with two or more.

The chamber cleaning gas containing FCOF may contain the other gases, for example, $CF_3OCOF$ and/or $CF_3OCF_2OCOF$.

Such $CF_3OCOF$ and $CF_3OCF_2OCOF$ are compounds obtainable as a mixture together with FCOF through preparation processes and preparation conditions. When they are prepared in a mixture, they can be separated by conventionally known processes such as distillation, and further the mixture can be used as the chamber cleaning gas.

When $CF_3OCOF$ is used as the chamber cleaning gas of the invention without the use of FCOF and $CF_3OCF_2OCOF$, the chamber cleaning gas may comprise $CF_3OCOF$ and $O_2$, and optionally the other gases.

The mixing molar ratio of $CF_3OCOF$ to $O_2$ ($CF_3OCOF/O_2$) satisfies preferably $0.4 \leq CF_3OCOF/O_2 \leq 9$, more preferably $0.5 \leq CF_3OCOF/O_2 \leq 6$, furthermore preferably $0.6 \leq CF_3OCOF/O_2 \leq 4$.

When $CF_3OCF_2OCOF$ is used as the chamber cleaning gas of the invention without the use of FCOF and $CF_3OCOF$, the chamber cleaning gas may comprise $CF_3OCF_2OCOF$ and $O_2$, and optionally the other gases.

In this case, the mixing molar ratio of $CF_3OCF_2OCOF$ to $O_2$ ($CF_3OCF_2OCOF/O_2$) satisfies preferably $0.25 \leq CF_3OCF_2OCOF/O_2 \leq 9$, more preferably $0.3 \leq CF_3OCF_2OCOF/O_2 \leq 4$, furthermore preferably $0.4 \leq CF_3OCF_2OCOF/O_2 \leq 2.5$.

When the first chamber cleaning gas of the invention comprises at least one compound selected from the group consisting of FCOF, $CF_3OCOF$ and $CF_3OCF_2OCOF$, and $O_2$, and optionally other gases, the total content of FCOF and $O_2$ is desirably in the range of 70 to 100 mol %, preferably 80 to 100 mol % based on the total gas amount being 100 mol %.

When the first chamber cleaning gas of the invention has the gas content and mixing molar ratio as described in the above, it is possible to attain the cleaning rate same as that of $C_2F_6$ used conventionally and also remove deposits adhered to chambers quickly.

Further, the exhaust gases evacuated after chamber cleaning contain by-products generated by decomposition of the cleaning gas. For example, the chamber cleaning is carried out using $C_2F_6$ as described in the above, the exhaust gas contains $CF_4$ having a long atmospheric lifetime of 50000 years and a high global warming potential. However, when the first chamber cleaning gas comprising FCOF and $O_2$ of the invention is used, it is possible to attain the cleaning rate same as that of $C_2F_6$ and also pronouncedly reduce the $CF_4$ content in the exhaust gas as compared with the use of $C_2F_6$.

The above described FCOF, $CF_3OCOF$ and $CF_3OCF_2OCOF$ used in the present invention easily react with moisture to decompose into HF and $CO_2$. On this account, even if FCOF, $CF_3OCOF$ and/or $CF_3OCF_2OCOF$ are discharged as un-decomposed exhaust gases after chamber cleaning, they can be easily decomposed into HF and $CO_2$ by a water scrubber of a conventional exhaust gas treatment system. So it is unnecessary for post treatment to use an additional combustion decomposition apparatus and thereby the system cost can be reduced.

Moreover, even if the gas is discharged in the atmosphere, it easily decomposes together with moisture in the atmosphere. The atmospheric lifetime thereof is estimated to be 1 year or less and the global warming potential thereof is considered to be the same as that of $CO_2$, which potential is much lower than that of $CF_4$. Therefore, it is considered the effect thereof on global warming is low.

FCOF has a low boiling point of $-83.1°$ C. and is in a gas state under conditions of semiconductor manufacturing so that the handling thereof is easy in chamber cleaning.

Further, for example, $CF_3OCOF$ has a boiling point of $-34°$ C. and $CF_3OCF_2OCOF$ has a boiling point of $+7°$ C., and they are in a gas state under conditions of semiconductor manufacturing so that the handling thereof is easy in chamber cleaning similar to FCOF.

The FCOF preparation process is not particularly limited, for example, comprises allowing carbon monoxide to react with a fluorine gas.

The $CF_3OCOF$ and $CF_3OCF_2OCOF$ preparation processes are not particularly limited, and may include conventionally known processes e.g. a process disclosed in U.S. Pat. No. 3,721,696. For example, $CF_3OCOF$ and $CF_3OCF_2OCOF$ can be prepared by allowing $C_3F_6$ to react with oxygen gas. The resulting compound, which depends on preparation conditions, can be prepared in a mixture of the above FCOF, $CF_3OCOF$ or $CF_3OCF_2OCOF$.

<Cleaning Gas Containing $CF_3COF$, $C_3F_7COF$ or $CF_2(COF)_2$>

The second chamber cleaning gas of the present invention comprises $CF_3COF$, $C_3F_7COF$ or $CF_2(COF)_2$, and $O_2$ and optionally other gases. Examples of the other gases used in the invention may include an inert gas such as $N_2$, He, Ne, Ar, Kr, Xe and Rn. The inert gas may be used alone or in a mixed gas of two or more.

In the use of $CF_3COF$ as the second chamber cleaning gas of the invention, the total amount of $CF_3COF$ and $O_2$ molar concentration is desirably in the range of 70 to 100 mol %, preferably 80 to 100 mol % based on the total gas amount being 100 mol %.

Further, the second chamber cleaning gas of the invention has a mixing molar ratio of $CF_3COF$ to $O_2$ ($CF_3COF/O_2$) satisfies preferably $0.25 \leq CF_3COF/O_2 \leq 1.5$, more preferably $0.4 \leq CF_3COF/O_2 \leq 1$, furthermore preferably $0.5 \leq CF_3COF/O_2 \leq 0.8$.

When the second chamber cleaning gas of the invention has the $CF_3COF$ content, the $O_2$ content, the other gas content and the mixing molar ratio of $CF_3COF$ to $O_2$ as described in the above, it is possible to attain about 70% of the cleaning rate of $C_2F_6$ used conventionally and also remove deposits adhered to chambers quickly.

In the use of $C_3F_7COF$ as the second chamber cleaning gas of the invention, the total amount of $C_3F_7COF$ and $O_2$ molar concentration is desirably in the range of 70 to 100 mol %, preferably 80 to 100 mol % based on the total gas amount being 100 mol %.

Further, the second chamber cleaning gas of the invention has a mixing molar ratio of $C_3F_7COF$ to $O_2$ ($C_3F_7COF/O_2$) satisfies preferably $0.1 \leq C_3F_7COF/O_2 \leq 0.7$, more preferably $0.15 \leq C_3F_7COF/O_2 \leq 0.6$, furthermore preferably $0.25 \leq C_3F_7COF/O_2 \leq 0.5$.

When the second chamber cleaning gas of the invention has the $C_3F_7COF$ content, the $O_2$ content, the other gas content and the mixing molar ratio of $C_3F_7COF$ to $O_2$ as described in the above, it is possible to attain about 70% of the cleaning rate of $C_2F_6$ used conventionally and also remove deposits adhered to chambers quickly.

In the use of $CF_2(COF)_2$ as the second chamber cleaning gas of the invention, the total amount of $CF_2(COF)_2$ and $O_2$ molar concentration is desirably in the range of 70 to 100 mol %, preferably 80 to 100 mol % based on the total gas amount being 100 mol %.

Further, the second chamber cleaning gas of the invention has a mixing molar ratio of $CF_2(COF)_2$ to $O_2$ ($CF_2(COF)_2/O_2$) satisfies preferably $0.15 \leq CF_2(COF)_2/O_2 \leq 1.3$, more preferably $0.25 \leq CF_2(COF)_2/O_2 \leq 1$, furthermore preferably $0.3 \leq CF_2(COF)_2/O_2 \leq 0.85$.

When the second chamber cleaning gas of the invention has the $CF_2(COF)_2$ content, the $O_2$ content, the other gas content and the mixing molar ratio of $CF_2(COF)_2$ to $O_2$ as described in the above, it is possible to attain about 70% of the cleaning rate of $C_2F_6$ used conventionally and also remove deposits adhered to chambers quickly.

Further, the exhaust gas evacuated after chamber cleaning contains by-products generated by decomposition of the cleaning gas. For example, the chamber cleaning is carried out using $C_2F_6$ as described in the above, the exhaust gas contains $CF_4$ having a long atmospheric lifetime of 50000 years and a high global warming potential. However, when the second chamber cleaning gas containing $CF_3COF$, $C_3F_7COF$ or $CF_2(COF)_2$, and $O_2$ of the invention is used, it is possible to attain about 70% of the cleaning rate of $C_2F_6$ and also reduce the $CF_4$ content in exhaust gas as compared with the use of $C_2F_6$.

The $CF_3COF$, $C_3F_7COF$ and $CF_2(COF)_2$ used in the present invention easily react with moisture to decompose into HF and $CF_3COOH$. On this account, even if $CF_3COF$, $C_3F_7COF$ and $CF_2(COF)_2$ are discharged as un-decomposed exhaust gas after chamber cleaning, they can be easily decomposed into HF and $CF_3COOH$ by a water scrubber of a conventional exhaust gas treatment system. So it is unnecessary for post treatment to use an additional combustion decomposition apparatus and thereby the system cost can be reduced.

Moreover, even if the exhaust gases are discharged in the atmosphere, they easily react with moisture in the atmosphere to decompose. The atmospheric lifetime thereof is estimated to be 1 year or less and the global warming potential thereof is much lower than that of $CF_4$, etc. Therefore, it is considered the effect thereof on global warming is low.

$CF_3COF$ has a boiling point of $-59°$ C., $C_3F_7COF$ has a boiling point of 2 to $5°$ C. and $CF_2(COF)_2$ has a boiling point of $-8°$ C., so that every boiling point is low. They are each in a gas state under conditions of semiconductor manufacturing so that the handling thereof is easy in chamber cleaning.

The $CF_3COF$ preparation process used in the present invention is not particularly limited, for example, comprises allowing trifluoroethanol ($CF_3CH_2OH$) to react with fluorine gas.

The $C_3F_7COF$ preparation process used in the invention is not particularly limited, and may include known processes, for example, a process of electrolysis fluorination of $C_3H_7COF$. Further, commercially available $C_3F_7COF$ is also employable.

The $CF_2(COF)_2$ preparation process used in the invention is not particularly limited, and may include known processes. For example, it is prepared by allowing $CH_2(COF)_2$ and NaF to react with fluorine gas.

<Other Optional Components>

The above other gases may include gases other than the above inert gases within the limit of not missing the object of the invention. Examples of the gases other than the inert gases may include $O_3$, $H_2$, $F_2$, $ClF_3$ or $BrF_3$.

<Chamber Cleaning>

The chamber cleaning used in the present invention means removing deposits adhered to chamber walls, jigs or pipes in a semiconductor manufacturing apparatus such as CVD equipment, etc.

The mixed gas containing the above fluorine-containing carbonyl compound, oxygen and the like can be used as the gas for cleaning chambers of CVD equipment, etc.

The objective compounds applicable for the chamber cleaning with the fluorine-containing carbonyl compound may include the above silicon-containing deposits (deposits containing silicon) adhered to the wall of a CVD chamber or jigs of CVD equipment by CVD processes or the like. The silicon-containing deposits may comprise for example, at least one of:

(1) silicon
(2) a compound of silicon and at least one of oxygen, nitrogen, fluorine and carbon, and
(3) a compound of a metal silicide having a high melting point. Specific examples thereof may include the metal silicide having a high melting point such as WSi, etc, and Si, $SiO_2$ and $Si_3N_4$.

The materials of the chambers for which the chamber cleaning gases of the present invention are used are not particularly limited, and for example, may include conventionally known materials. Examples of such chamber materials may include stainless steel, aluminum or alloys thereof.

The chamber cleaning gases of the invention exert a little effect such as corrosion on such chambers so that the above deposits adhered to the chambers can be removed selectively and quickly.

For cleaning silicon-containing deposits in chambers using such fluorine compounds of the invention, conventionally known processes can be employed. Applicable examples thereof may include various dry cleaning methods such as plasma cleaning, remote plasma cleaning or microwave cleaning.

The use of the chamber cleaning gases of the present invention enables to remove silicon-containing deposits.

[Etching Gas for Silicon-Containing Films]

The first etching gas for silicon-containing films of the present invention is an etching gas for silicon-containing films comprising at least one compound selected from the group consisting of FCOF, $CF_3OCOF$ and $CF_3OCF_2OCOF$.

The second etching gas for silicon-containing films of the present invention is an etching gas for silicon-containing films comprising $CF_3COF$, $C_3F_7COF$ or $CF_2(COF)_2$.

These will be described in order hereinafter.

<Etching Gas for Silicon-Containing Films Comprising at Least One Compound Selected From the Group Consisting of FCOF, $CF_3OCOF$ and $CF_3OCF_2OCOF$>

The first silicon-containing film etching gas of the invention is a silicon-containing film etching gas comprising at least one compound selected from the group consisting of FCOF, $CF_3OCOF$ and $CF_3OCF_2OCOF$.

Of these, FCOF is preferably used.

In the use of FCOF, the silicon-containing film-etching gas comprises FCOF and $O_2$, and optionally other gases and the total content of FCOF and $O_2$ is desirably in the range of 70 to 100 mol %, preferably 80 to 100 mol % based on the total gas amount being 100 mol %.

The mixing molar ratio of FCOF to $O_2$ ($FCOF/O_2$) desirably satisfies $1 \leq FCOF/O_2 \leq 9$, preferably $1.5 \leq FCOF/O_2 \leq 6$, more preferably $2.3 \leq FCOF/O_2 \leq 6$.

In the silicon containing film-etching gas containing FCOF, the other gases include, for example, an inert gas such as $N_2$, He, Ne, Ar, Kr, Xe and Rn. The inert gas may be used alone or in a mixed gas with two or more.

The silicon containing film-etching gas containing FCOF may contain the other gases, for example, $CF_3OCOF$ and/or $CF_3OCF_2OCOF$.

Such $CF_3OCOF$ and $CF_3OCF_2OCOF$ are compounds obtainable as a mixture together with FCOF through preparation processes and preparation conditions in some cases. When they are prepared in a mixture, they can be separated by conventionally known processes such as distillation, and further the mixture can be used as the silicon containing film-etching gas.

When $CF_3OCOF$ is used as the silicon containing film-etching gas of the invention without the use of FCOF and $CF_3OCF_2OCOF$, the silicon containing film-etching gas may comprise $CF_3OCOF$ and $O_2$, and optionally the other gases.

The mixing molar ratio of $CF_3OCOF$ to $O_2$ ($CF_3OCOF/O_2$) satisfies preferably $0.4 \leq CF_3OCOF/O_2 \leq 9$, more preferably $0.5 \leq CF_3OCOF/O_2 \leq 6$, furthermore preferably $0.6 \leq CF_3OCOF/O_2 \leq 4$.

When $CF_3OCF_2OCOF$ is used as the silicon containing film-etching gas of the invention without the use of FCOF and $CF_3OCOF$, the silicon containing film-etching gas may comprise $CF_3OCF_2OCOF$ and $O_2$, and optionally the other gases.

The mixing molar ratio of $CF_3OCF_2OCOF$ to $O_2$ ($CF_3OCF_2OCOF/O_2$) satisfies preferably $0.25 \leq CF_3OCF_2OCOF/O_2 \leq 9$, more preferably $0.3 \leq CF_3OCF_2OCOF/O_2 \leq 4$, furthermore preferably $0.4 \leq CF_3OCF_2OCOF/O_2 \leq 2.5$.

When the first silicon containing film-etching gas of the invention comprises at least one compound selected from the group consisting of FCOF, $CF_3OCOF$ and $CF_3OCF_2OCOF$, and $O_2$, and optionally other gases, the total content of FCOF and $O_2$ is desirably in the range of 70 to 100 mol %, preferably 80 to 100 mol % based on the total gas amount being 100 mol %.

When the first silicon containing film-etching gas of the invention has the gas content and mixing molar ratio as described in the above, it is possible to attain the etching rate same as that of $C_2F_6$ used conventionally.

Further, when the etching is carried out using $C_2F_6$ as described in the above, the exhaust gas contains $CF_4$ having a high global warming potential as byproducts. However, when the first silicon containing film-etching gas comprising at least one compound of FCOF, $CF_3OCOF$ and $CF_3OCF_2OCOF$, and $O_2$ of the invention is used, it is possible to attain the etching rate same as that of $C_2F_6$ and also pronouncedly reduce the $CF_4$ content in the exhaust gas as compared with the use of $C_2F_6$.

The FCOF used in the present invention reacts with moisture easily to decompose into HF and $CO_2$. On this account, the decomposition treatment is easily conducted thereby reducing the system cost.

Moreover, even if the exhaust gas is discharged in the atmosphere, it easily reacts with moisture in the atmosphere to decompose. Therefore, it is considered the effect thereof on global warming is low.

As described in the above, FCOF has a low boiling point of −83.1° C. and is in a gas state under conditions of semiconductor manufacturing so that the handling thereof is easy in etching. Further, $CF_3OCOF$ has a boiling point of −34° C. and $CF_3OCF_2OCOF$ has a boiling point of +7° C., and they are in a gas state under conditions of semiconductor manufacturing so that the handling thereof is easy in the silicon containing film etching, similar to FCOF.

The FCOF, $CF_3OCOF$ and $CF_3OCF_2OCOF$ preparation processes and accesses are the same as the above-described processes. The first etching gas of the invention has good selectivity to films for processing and thereby is sufficiently applicable as alternating gases for $C_2F_6$, etc.

<Etching Gas Containing $CF_3COF$>

The second silicon-containing film etching gas of the present invention comprises $CF_3COF$, $C_3F_7COF$ or $CF_2(COF)_2$, and $O_2$ and optionally other gases. Examples of the other gases used in the invention may include an inert gas such as $N_2$, He, Ne, Ar, Kr, Xe and Rn. The inert gas may be used alone or in a mixed gas of two or more.

In the use of $CF_3COF$ as the second silicon containing film-etching gas of the invention, the total amount of $CF_3COF$ and $O_2$ molar concentration is desirably in the range of 70 to 100 mol %, preferably 80 to 100 mol % based on the total gas amount being 100 mol %.

Further, the second silicon containing film-etching gas has a mixing molar ratio of $CF_3COF$ to $O_2$ ($CF_3COF/O_2$) satisfies preferably $0.25 \leq CF_3COF/O_2 \leq 1.5$, more preferably $0.4 \leq CF_3COF/O_2 \leq 1$, furthermore preferably $0.5 \leq CF_3COF/O_2 > 0.8$.

When the second silicon containing film-etching gas of the invention has the $CF_3COF$ content, the $O_2$ content, the other gas content and the mixing molar ratio of $CF_3COF$ to $O_2$ as described in the above, it is possible to attain about 70% of the etching rate of $C_2F_6$ used conventionally.

In the use of $C_3F_7COF$ as the second silicon containing film-etching gas of the invention, the total amount of $C_3F_7COF$ and $O_2$ molar concentration is desirably in the range of 70 to 100 mol %, preferably 80 to 100 mol % based on the total gas amount being 100 mol %.

Further, the second silicon containing film-etching gas has a mixing molar ratio of $C_3F_7COF$ to $O_2$ ($C_3F_7COF/O_2$) satisfies preferably $0.1 \leq C_3F_7COF/O_2 \leq 0.7$, more preferably $0.15 \leq C_3F_7COF/O_2 \leq 0.6$, furthermore preferably $0.1 \leq C_3F_7COF/O_2 \leq 0.5$.

When the second silicon containing film-etching gas of the invention has the $C_3F_7COF$ content, the $O_2$ content, the other gas content and the mixing molar ratio of $C_3F_7COF$ to $O_2$ as described in the above, it is possible to attain about 70% of the etching rate of $C_2F_6$ used conventionally and also remove deposits adhered to chambers quickly.

In the use of $CF_2(COF)_2$ as the second silicon containing film-etching gas of the invention, the total amount of $CF_2(COF)_2$ and $O_2$ molar concentration is desirably in the range of 70 to 100 mol %, preferably 80 to 100 mol % based on the total gas amount being 100 mol %.

Further, the second silicon-containing film etching gas of the invention has a mixing molar ratio of $CF_2(COF)_2$ to $O_2$ ($CF_2(COF)_2/O_2$) satisfies preferably $0.15 \leq CF_2(COF)_2/O_2 \leq 1.3$, more preferably $0.25 \leq CF_2(COF)_2/O_2 \leq 1$, furthermore preferably $0.3 \leq CF_2(COF)_2/O_2 \leq 0.85$.

When the second silicon containing film-etching gas of the invention has the $CF_2(COF)_2$ content, the $O_2$ content, the other gas content and the mixing molar ratio of $CF_2(COF)_2$ to $O_2$ as described in the above, it is possible to attain about 70% of the etching rate of $C_2F_6$ used conventionally.

Further, when the etching is carried out using $C_2F_6$ as described in the above, the exhaust gas contains $CF_4$ having a long atmospheric lifetime of 50000 years and a high global warming potential. However, when the second silicon containing film-etching gas containing $CF_3COF$, $C_3F_7COF$ or $CF_2(COF)_2$, and $O_2$ of the invention is used, it is possible to attain about 70% of the etching rate of $C_2F_6$ and also reduce the $CF_4$ content in the exhaust gas as compared with the use of $C_2F_6$.

The above described $CF_3COF$, $C_3F_7COF$ and $CF_2(COF)_2$ used in the present invention easily react with moisture to decompose into HF and $CF_3COOH$. On this account, even if $CF_3COF$, $C_3F_7COF$ and $CF_2(COF)_2$ are discharged as un-decomposed exhaust gas after etching, they can easily decompose into HF and $CF_3COOH$ by a water scrubber which is a conventional exhaust gas treatment system and it is unnecessary for post treatment to use an additional combustion decomposition apparatus and thereby the system cost can be reduced.

Moreover, even if the exhaust gas is discharged in the atmosphere, they easily react with moisture in the atmosphere to decompose. The atmospheric lifetime thereof is estimated to be 1 year or less and the global warming potential thereof is much lower than that of $CF_4$, etc. Therefore, it is considered the effect thereof on global warming is low.

Further, $CF_3COF$ has a boiling point of −59° C., $C_3F_7COF$ has a boiling point of 2 to 5° C. and $CF_2(COF)_2$ has a boiling point of −8° C., so that every boiling point is low. They are each in a gas state under conditions of semiconductor manufacturing so that the handling thereof is easy in etching.

The $CF_3COF$, $C_3F_7COF$ and $CF_2(COF)_2$ preparation processes and accesses are the same as in the above-described processes. The second etching gas of the invention has good selectivity to films for processing and thereby is sufficiently applicable as alternating gases for $C_2F_6$, etc.

<Other Optional Components>

The above other gases may include gases other than the above inert gases within the limit of not missing the object of the invention. Examples of the gases other than the inert gases may include $O_3$, $H_2$, $F_2$, $ClF_3$ or $BrF_3$.

<Etching>

The objective compounds applicable for the etching may include silicon-containing films (films containing silicon) or the like. The silicon-containing films may include, for example, at least one of:

(1) a silicon film (2) a film of silicon and at least one of oxygen, nitrogen, fluorine and carbon, and (3) a film of a metal silicide having a high melting point. Specific examples thereof may include Si film, $SiO_2$ film, $Si_3N_4$ film or metal silicides having a high melting point such as WSi film.

The process of etching the silicon-containing films with the fluorine-containing carbonyl compound of the present invention may include conventionally known processes.

Applicable examples thereof may include various dry etching methods such as plasma etching, reactive ion etching or microwave etching. For the silicon-containing film etching conditions, known etching conditions are applicable.

INDUSTRIAL AVAILABILITY

The chamber cleaning gas of the present invention which comprises the above gases in a specific proportion has the almost same excellent cleaning rate as that of conventionally used $C_2F_6$ And also the chamber cleaning gas of the invention has a low global warming potential and can remarkably reduce the $CF_4$ generation wherein $CF_4$ is an exhaust gas being harmful to the environment and being perceived as contributing to global warming after cleaning by use of the gas. The chamber cleaning gas of the present invention, further, has easy handling and excellent exhaust gas treating properties thereby enhancing economic properties and workability for the chamber cleaning.

The etching gas for silicon-containing films of the present invention which comprises the above gases in a specific proportion has the almost same excellent etching rate as that of conventionally used $C_2F_6$ And also the etching gas for silicon-containing films of the present invention has a low global warming potential and can remarkably reduce the $CF_4$ generation wherein $CF_4$ is an exhaust gas being harmful to the environment and being perceived as contributing to global warming after etching by use of it. The etching gas of the present invention, further, has easy handling and excellent exhaust gas treating properties thereby enhancing economic properties and workability for the etching. The etching by use of the gas enables to remove silicon-containing films efficiently and further the etching can be performed while keeping the dimensional accuracy of semiconductor patterns high so that the etching gas of the invention has excellent etching properties.

EXAMPLES

The present invention is further described with reference to the following examples which do not limit the present invention.

Preparation Example 1
[Synthesis of FCOF]

To a dried 100 ml quartz reactor, 5.6 g (0.2 mol) of carbon monoxide (CO) was charged and thereto, 26 L (0.23 mol of $F_2$) of 20 mol % diluent fluorine gas diluted with nitrogen gas in standard conditions (0° C., 1 atm) was added gradually and the reaction was conducted at 0° C. for 1 hr. The reaction product was separated and purified, and 6.6 g (0.1 mol) of FCOF was obtained. The resulting compound was analyzed with gas chromatography and FT-IR and thereby it was confirmed that the resulting compound was FCOF. The yield thereof was 50% based on carbon monoxide.

Preparation Example 2
[Synthesis of $CF_3COF$]

To a dried 100 ml SUS 316 reactor, 20 g (0.2 mol) of trifluoroethanol ($CF_3CH_2OH$) was weighed and charged, and thereto, 30 L (0.27 mol of $F_2$) of 20 mol % diluent fluorine gas diluted with nitrogen gas in standard conditions (0° C., 1 atm) was added and the reaction was conducted at 0° C. for 5 hr. The reaction product was separated and purified, and 9.2 g (0.08 mol) of $CF_3COF$ was obtained. The resulting compound was analyzed with gas chromatography and FT-IR and thereby it was confirmed that the resulting compound was $CF_3COF$. The yield thereof was 40% on the basis of trifluoroethanol.

Preparation Example 3
[Synthesis of $CF_2(COF)_2$]

To a 1 L monel metal reactor charged with 18 g (0.43 mol) of NaF, 12.1 g (0.112 mol) of $CH_2(COF)_2$ was charged with condensation, and thereto, 0.1 g/h of fluorine gas was blown gradually while controlling increasing the inner pressure with keeping the reactor at 0° C., and the reaction was conducted. When the total pressure increased by the product reached to 0.44 atm, the blowing of fluorine gas was finshed. The reaction product was separated and purified, and 1.7 g (0.0118 mol) of $CF_2(COF)_2$ was obtained. It was confirmed with FT-IR and $^{19}$F-NMR that the resulting compound was $CF_2(COF)_2$. The yield thereof was 10%.

Examples 1–5, Comparative Example 1
[Chamber Cleaning]

In each example, a silicon wafer superimposed with a $SiO_2$ film was placed inside a CVD chamber, and using a mixed gas comprising FCOF synthesized in Preparation example 1 and oxygen in the proportion as shown in Table 1, the $SiO_2$ film was cleaned in conditions such that the pressure was 250 Pa, the input Rf electric power was 750 W, the total gas flow rate was 300 sccm, the electrode temperature was 300° C. and the distance of electrodes was 50 mm. After the completion of the cleaning, generated exhaust gas was diluted with 15.5 L/min of nitrogen and analyzed by FT-IR to determine $CF_4$ contained in the exhaust gas.

The results of cleaning for 0.5 min under the above conditions are shown in Table 1.

The $CF_4$ content in the exhaust gas generated after the cleaning is also shown in Table 1.

TABLE 1

|  | Ex 1 | Ex 2 | Ex 3 | Ex 4 | Ex 5 | Com Ex 1 |
|---|---|---|---|---|---|---|
| Composition Of Cleaning gas |  |  |  |  |  |  |
| $COF_2$ content (mol %) | 60 | 70 | 75 | 80 | 85 | 100 |
| $O_2$ content (mol %) | 40 | 30 | 25 | 20 | 15 | 0 |
| $COF_2/O_2$ | 1.5 | 2.3 | 3 | 4 | 5.7 |  |
| $COF_2 + O_2$ content in total gas amount (mol %) | 100 | 100 | 100 | 100 | 100 | 100 |
| Cleaning rate (Å/min) | 9000 | 9200 | 9650 | 9700 | 9400 | 6700 |
| $CF_4$ content in exhaust gas (mol %) | 0.025 | — | — | 0.064 | — | 0.298 |

Examples 6–10
[Chamber Cleaning]

In each example, a $SiO_2$ film was cleaned using a mixed gas comprising $CF_3COF$ synthesized in Preparation Example 2 and oxygen in the proportion as shown in Table 2 under the same conditions as in Example 1.

The results are shown in Table 2.

The $CF_4$ content in the exhaust gas generated after the cleaning is shown in Table 2.

TABLE 2

|  | Ex 6 | Ex 7 | Ex 8 | Ex 9 | Ex 10 |
|---|---|---|---|---|---|
| Composition Of Cleaning gas |  |  |  |  |  |
| $CF_3COF$ content (mol %) | 20 | 30 | 40 | 50 | 60 |
| $O_2$ content (mol %) | 80 | 70 | 60 | 50 | 40 |
| $CF_3COF/O_2$ | 0.25 | 0.43 | 0.67 | 1 | 1.5 |

TABLE 2-continued

|  | Ex 6 | Ex 7 | Ex 8 | Ex 9 | Ex 10 |
|---|---|---|---|---|---|
| $CF_3COF + O_2$ content in total gas amount (mol %) | 100 | 100 | 100 | 100 | 100 |
| Cleaning rate (Å/min) | 5600 | 7000 | 7400 | 6700 | 4900 |
| $CF_4$ content in exhaust gas (mol %) | 0.035 | — | 0.17 | — | 0.56 |

Comparative Examples 2–8
[Chamber Cleaning]

In each example, a $SiO_2$ film was cleaned using a mixed gas comprising $C_2F_6$ and oxygen in the proportion as shown in Table 3 under the same conditions as in Example 1. The results are shown in Table 3.

The $CF_4$ content in the exhaust gas generated after the cleaning is also shown in Table 3.

TABLE 3

|  | Comparative example | | | | | | |
|---|---|---|---|---|---|---|---|
|  | 2 | 3 | 4 | 5 | 6 | 7 | 8 |
| Composition Of Cleaning gas | | | | | | | |
| $C_2F_6$ content (mol %) | 20 | 30 | 40 | 45 | 50 | 60 | 70 |
| $O_2$ content (mol %) | 80 | 70 | 60 | 55 | 50 | 40 | 30 |
| $C_2F_6 + O_2$ content in total gas amount (mol %) | 100 | 100 | 100 | 100 | 100 | 100 | 100 |
| Cleaning rate (Å/min) | 6500 | 9000 | 10600 | 10900 | 10700 | 10300 | 6700 |
| $CF_4$ content in exhaust gas (mol %) | 0.061 | — | — | 0.276 | — | 0.626 | 0.970 |

(Note)
It is undesirable the $CF_4$ content in the exhaust gas is large because the global warming function thereof becomes large.

Examples 11–15
[Chamber Cleaning]

In each example, a $SiO_2$ film was cleaned using a mixed gas comprising commercially available $C_3F_7COF$ (manufactured by Synquest Co., heptafluorobutylyl fluoride 98%: catalog number 2116-2-07) and oxygen in the proportion as shown in Table 4 under the same conditions as in Example 1.

The results are shown in Table 4.

The $CF_4$ content in the exhaust gas generated after the cleaning is also shown in Table 4.

TABLE 4

|  | Ex 11 | Ex 12 | Ex 13 | Ex 14 | Ex 15 |
|---|---|---|---|---|---|
| Composition of Cleaning gas | | | | | |
| $C_3F_7COF$ content of (mol %) | 10 | 20 | 25 | 30 | 40 |

TABLE 4-continued

|  | Ex 11 | Ex 12 | Ex 13 | Ex 14 | Ex 15 |
|---|---|---|---|---|---|
| $O_2$ content gas (mol %) | 90 | 80 | 75 | 70 | 60 |
| $C_3F_7COF/O_2$ | 0.11 | 0.25 | 0.33 | 0.43 | 0.67 |
| $C_3F_7COF + O_2$ content in total gas amount (mol %) | 100 | 100 | 100 | 100 | 100 |
| Cleaning rate (Å/min) | 6270 | 8850 | 8570 | 7510 | 4530 |
| $CF_4$ content in exhaust gas (mol %) | 0.018 | — | 0.22 | — | 0.86 |

Examples 16–19
[Chamber Cleaning]

In each example, a $SiO_2$ film was cleaned using a mixed gas comprising $CF_2(COF)_2$ synthesized in Preparation Example 3 and oxygen in the proportion as shown in Table 5 under the same conditions as in Example 1.

The results are shown in Table 5.

The $CF_4$ content in the exhaust gas generated after the cleaning is also shown in Table 5.

TABLE 5

|  | Ex 16 | Ex 17 | Ex 18 | Ex 19 |
|---|---|---|---|---|
| Composition of Cleaning gas | | | | |
| $CF_2(COF)_2$ content (mol %) | 20 | 30 | 40 | 46.1 |
| $O_2$ content (mol %) | 80 | 70 | 60 | 53.9 |
| $CF_2(COF)_2/O_2$ | 0.25 | 0.43 | 0.67 | 0.86 |
| $CF_2(COF)_2 + O_2$ content in total gas amount (mol %) | 100 | 100 | 100 | 100 |
| Cleaning rate (Å/min) | 4590 | 5870 | 6000 | 5390 |
| $CF_4$ content in exhaust gas (mol %) | 0.019 | 0.4 | — | 0.195 |

What is claimed is:

1. A gas comprising FCOF and $O_2$ wherein the mixing molar ratio of FCOF to $O_2$ (FCOF/$O_2$) satisfies the formula $1 \leq FCOF/O_2 \leq 9$, and optionally other gases, wherein the total content of FCOF and $O_2$ is in the range of 70 to 100 mol % based on the total gas amount being 100 mol %.

2. The gas according to claim 1, wherein the other gases comprise at least one inert gas selected from $N_2$, He, Ne, Ar, Kr, Xe and Rn.

3. The gas according to claim 1, wherein the other gases include $CF_3OCOF$ and/or $CF_3OCF_2OCOF$.

4. A method comprising cleaning a chamber of CVD equipment with the gas according to claim 3.

5. A method comprising cleaning a chamber of CVD equipment with the gas according to claim 1.

6. A method comprises removing silicon-containing deposits with the gas according to claim 5.

7. A method comprising removing silicon-containing deposits with the gas according to claim 1.

8. The method according to claim 7, wherein the silicon-containing deposits comprise at least one of:
   (1) silicon,
   (2) a compound comprising silicon and at least one of oxygen, nitrogen, fluorine and carbon, and
   (3) a compound of a metal silicide having a high melting point.

9. A method comprising etching a silicon-containing film with a gas, which gas comprises FCOF and $O_2$, wherein the mixing molar ratio of FCOF to $O_2$ (FCOF/$O_2$) satisfies the formula $1 \leq FCOF/O_2 \leq 9$, and optionally other gases, wherein the total content of FCOF and $O_2$ is in the range of 70 to 100 mol % based on the total gas amount being 100 mol %.

10. The method according to claim 9, wherein the other gases comprise at least one inert gas selected from $N_2$, He, Ne, Ar, Kr, Xe and Rn.

11. The method according to claim 9, wherein the silicon-containing films comprise at least one of:
   (1) a silicon film,
   (2) a film comprising silicon and at least one of oxygen, nitrogen, fluorine and carbon, and
   (3) a film of a metal silicide having a high melting point.

12. The method according to claim 9, wherein the other gases comprise $CF_3OCOF$ and/or $CF_3OCF_2OCOF$.

13. The method according to claim 12, wherein the silicon-containing film comprises at least one of:
   (1) a silicon film,
   (2) a film comprising silicon and at least one of oxygen, nitrogen, fluorine and carbon, and
   (3) a film of a metal silicide having a high melting point.

14. A gas comprising $CF_3OCOF$ and $O_2$, and optionally other gases.

15. The gas according to claim 14, wherein the other gases comprises at least one inert gas selected from $N_2$, He, Ne, Ar, Kr, Xe and Rn.

16. A method comprising etching a silicon-containing film with a gas, which gas comprises $CF_3OCOF$ and $O_2$, and optionally other gases.

17. The method according to claim 16, wherein the other gases comprises at least one inert gas selected from $N_2$, He, Ne, Ar, Kr, Xe and Rn.

18. A gas comprising $CF_3OCF_2OCOF$ and $O_2$, and optionally other gases.

19. The gas according to claim 18, wherein the other gases comprise at least one inert gas selected from $N_2$, He, Ne, Ar, Kr, Xe and Rn.

20. A method comprising etching a silicon-containing film with a gas, which gas comprises $CF_3OCF_2OCOF$ and $O_2$, and optionally other gases.

21. The method according to claim 20, wherein the other gases comprise at least one inert gas selected from $N_2$, He, Ne, Ar, Kr, Xe and Rn.

22. A gas comprising at least one fluorine compound selected from the group consisting of FCOF, $CF_3OCOF$ and $CF_3OCF_2OCOF$, and $O_2$, wherein the mixing molar ratio of the at least one fluorine compound to $O_2$ (F compound/$O_2$) satisfies the formula $1 \leq F$ compound/$O_2 \leq 9$, and optionally other gases, wherein the total content of the at least one fluorine compound and $O_2$ is in the range of 70 to 100 mol % based on the total gas amount being 100 mol %.

23. A method comprising etching a silicon-containing film with a gas, which gas comprises at least one fluorine compound selected from the group consisting of FCOF, $CF_3OCOF$ and $CF_3OCF_2OCOF$, and $O_2$, wherein the mixing molar ratio of the at least one fluorine compound to $O_2$ (F compound/$O_2$) satisfies the formula $1 \leq F$ compound/$O_2 \leq 9$, and optionally other gases, wherein the total content of the at least one fluorine compound and $O_2$ is in the range of 70 to 100 mol % based on the total gas amount being 100 mol %.

24. A gas comprising $CF_2(COF)_2$ and $O_2$, and optionally other gases, wherein the total content of $CF_2(COF)_2$ and $O_2$ is in the range of 70 to 100 mol % based on the total gas amount being 100 mol %.

25. The gas according to claim 24, wherein the other gases comprise at least one inert gas selected from $N_2$, He, Ne, Ar, Kr, Xe and Rn.

26. A method comprising etching a silicon-containing film with a gas, which gas comprises $CF_2(COF)_2$ and $O_2$, and optionally other gases, wherein the total content of $CF_2(COF)_2$ and $O_2$ is in the range of 70 to 100 mol % based on the total gas amount being 100 mol %.

27. The method according to claim 26, wherein the other gases comprise at least one inert gas selected from $N_2$, He, Ne, Ar, Kr, Xe and Rn.

* * * * *

UNITED STATES PATENT AND TRADEMARK OFFICE
CERTIFICATE OF CORRECTION

PATENT NO. : 6,787,053 B2  
DATED : September 7, 2004  
INVENTOR(S) : Sekiya et al.

Page 1 of 1

It is certified that error appears in the above-identified patent and that said Letters Patent is hereby corrected as shown below:

Title page,  
Item [73], Assignee, should read
-- [73] Assignee: National Institute of Advanced Industrial Science and Technology, Tokyo (JP); Asahi Glass Company, Limited, Tokyo (JP); Anelva Corporation, Fuchu (JP); Ulvac, Inc., Chigasaki (JP); Kanto Denka Kogyo Co., Ltd., Tokyo (JP); Sanyo Electric Co., Ltd., Moriguchi (JP); Sony Corporation, Tokyo (JP); Daikin Industries, Ltd., Osaka (JP); Tokyo Electron Limited, Tokyo (JP); NEC Electronics Corporation, Kawasaki (JP); Hitachi Kokusai Electric Inc., Tokyo (JP); Matsushita Electric Industrial Co., Ltd, Kadoma (JP); Renesas Technology Corp., Tokyo (JP) --

Signed and Sealed this

Twenty-fifth Day of January, 2005

JON W. DUDAS  
*Director of the United States Patent and Trademark Office*